United States Patent
Scheungraber et al.

(10) Patent No.: US 7,881,066 B2
(45) Date of Patent: Feb. 1, 2011

(54) APPARATUS FOR ATTACHING AN ELECTRONIC COMPONENT TO A RUBBER ARTICLE

(75) Inventors: Patric Scheungraber, Pliening (DE); Ludwig Ketzer, Regau (DE); Egon Regauer, Forstem (DE)

(73) Assignee: Stahlgruber Otto Gruber AG, Poing (DE)

( * ) Notice: Subject to any disclaimer, the term of this patent is extended or adjusted under 35 U.S.C. 154(b) by 1154 days.

(21) Appl. No.: 11/391,831

(22) Filed: Mar. 29, 2006

(65) Prior Publication Data
US 2006/0220816 A1 Oct. 5, 2006

(30) Foreign Application Priority Data
Mar. 31, 2005 (DE) .................. 20 2005 005 144 U

(51) Int. Cl.
*H05K 7/02* (2006.01)
*H05K 7/06* (2006.01)
*H05K 7/08* (2006.01)
*H05K 7/10* (2006.01)

(52) U.S. Cl. ....................... 361/760; 361/749; 361/750; 361/761

(58) Field of Classification Search ......... 340/442–448; 152/152.1, 428, 443–444, 526; 361/749–750

See application file for complete search history.

(56) References Cited

U.S. PATENT DOCUMENTS

| | | | | |
|---|---|---|---|---|
| 5,218,861 | A * | 6/1993 | Brown et al. | ............... 73/146.5 |
| 5,731,754 | A * | 3/1998 | Lee et al. | .................... 340/447 |
| 6,581,657 | B1 * | 6/2003 | Brown | ...................... 152/152.1 |
| 6,788,192 | B2 * | 9/2004 | Shimura | ..................... 340/447 |

FOREIGN PATENT DOCUMENTS

| | | |
|---|---|---|
| DE | 197 13 560 A1 | 12/1998 |
| DE | 102 43 441 B4 | 4/2004 |
| DE | 600 12 793 T2 | 8/2004 |
| EP | 0 936 089 A2 | 8/1999 |
| EP | 1 439 079 A2 | 7/2004 |
| WO | WO 00/07834 | 2/2000 |
| WO | WO 01/25034 A1 | 4/2001 |
| WO | WO 03/070496 A1 | 8/2003 |
| WO | WO 2004/024474 A1 | 3/2004 |

* cited by examiner

*Primary Examiner*—Tuan T Dinh
(74) *Attorney, Agent, or Firm*—The Maxham Firm

(57) ABSTRACT

A main body for attaching an electronic component, for example, a transponder, on a rubber article, such as a tire, a conveyor belt, or the like. The mount has a connecting layer made, in one embodiment, of uncured, curable rubber material which is covered by an adhering protection film prior to use. A main body made of cured or uncured rubber material is permanently connected with this connecting layer and has a recess for accommodating the electronic component. A cover preferably made of the main body material, serves for fixing the electronic component in the recess in the main body.

12 Claims, 4 Drawing Sheets a b

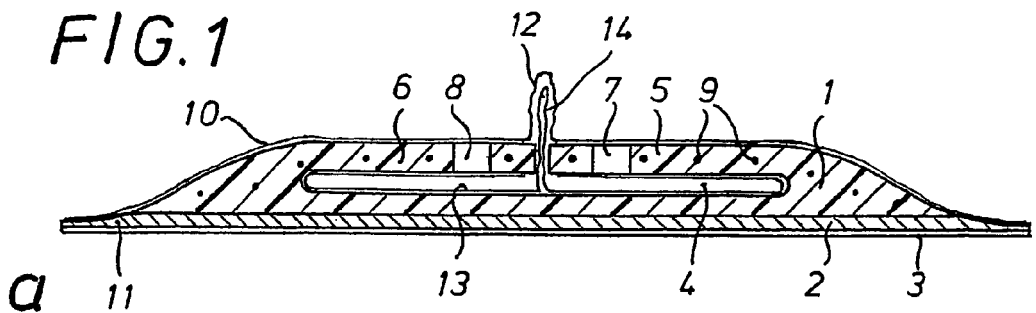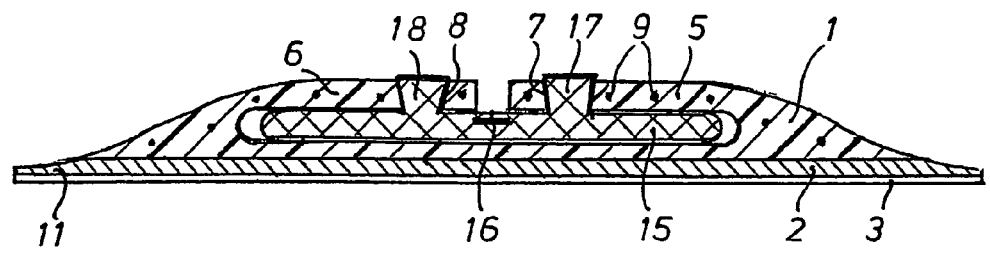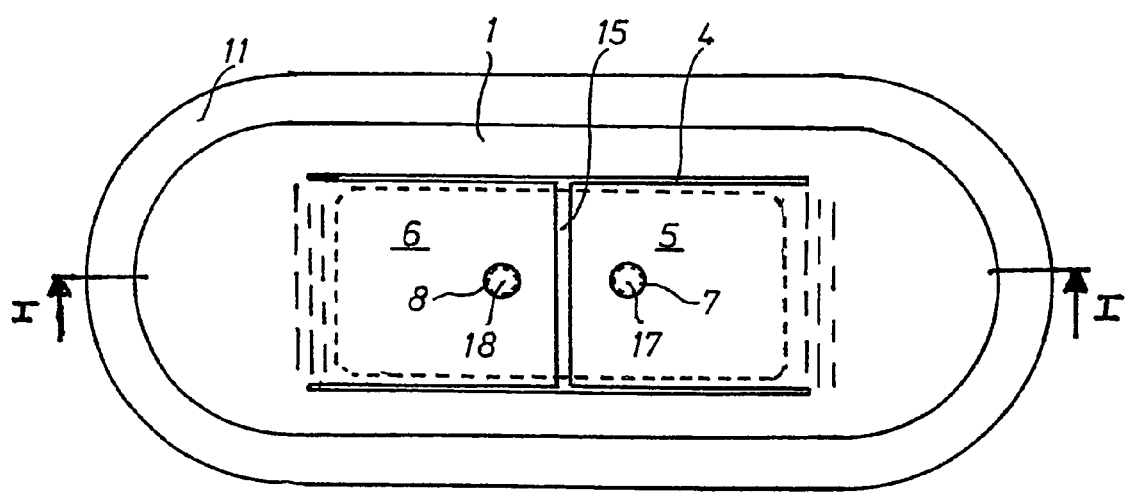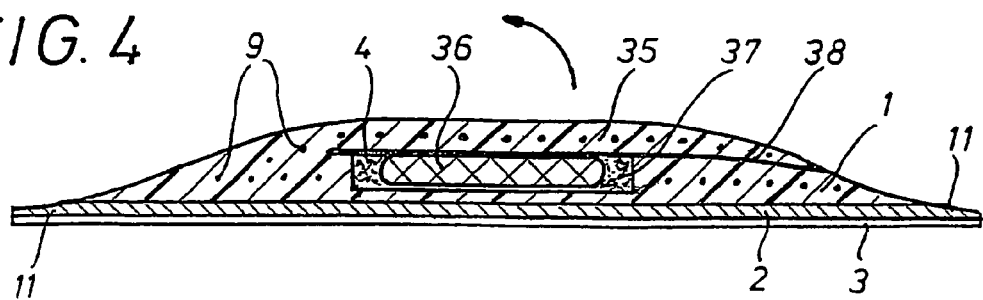

FIG. 5
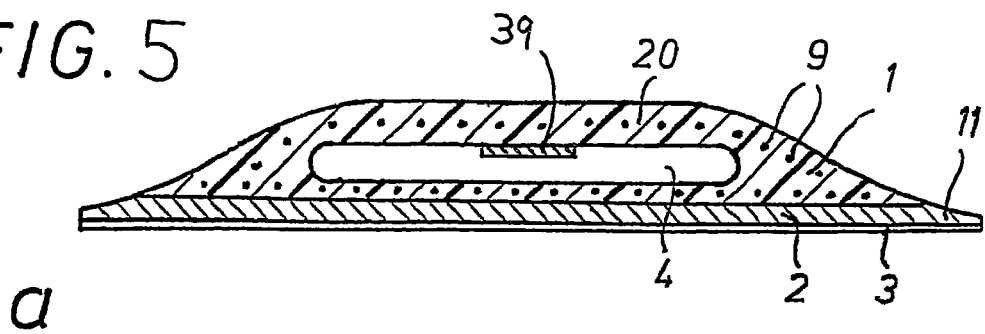
a
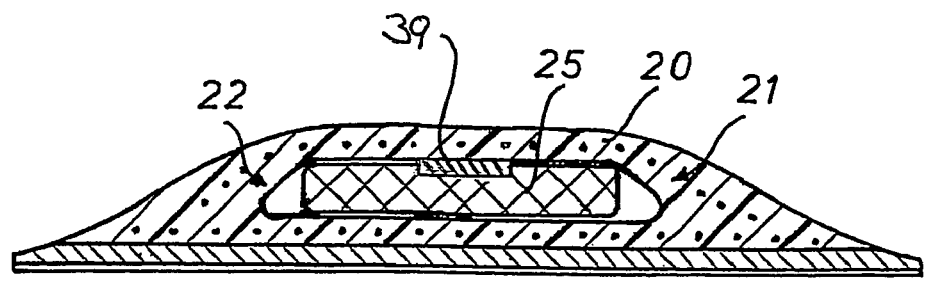
b
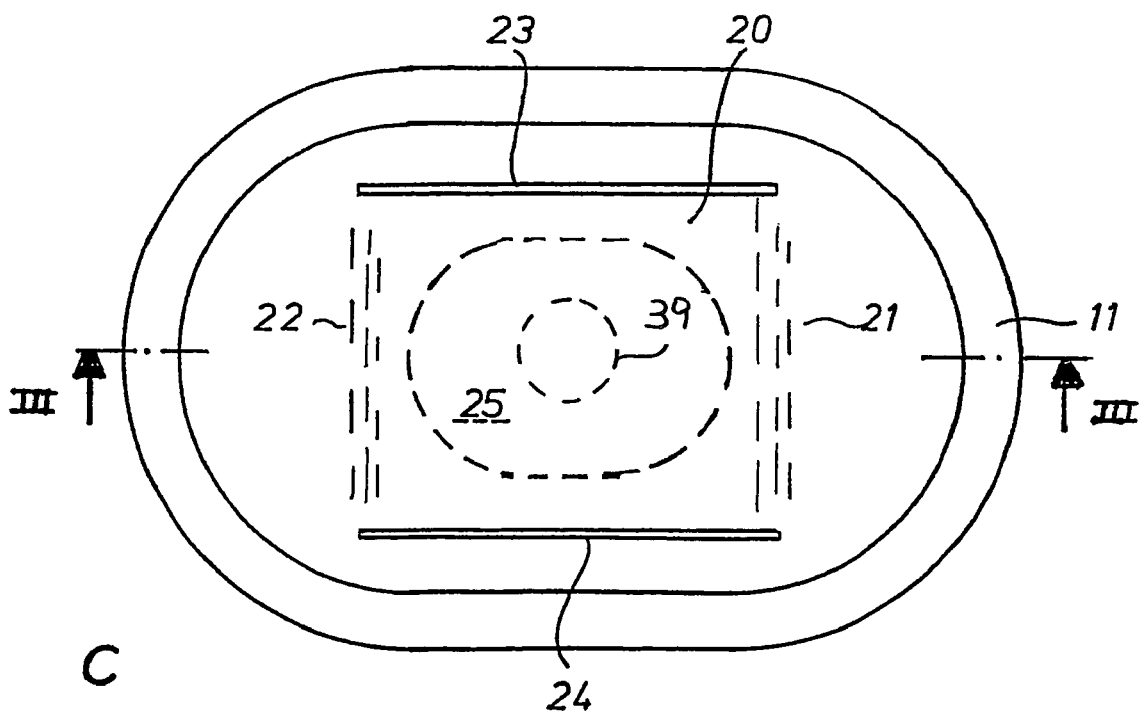
c

APPARATUS FOR ATTACHING AN ELECTRONIC COMPONENT TO A RUBBER ARTICLE

BACKGROUND

1. Field of the Invention

The invention relates to a mount for attaching an electronic component to a rubber article, such as a tire, a conveyor belt, or the like.

2. Background Discussion

Various systems for marking pneumatic tires for automobiles and commercial vehicles have recently become known, which contain electronically stored and recallable data records for various parameters of the particular pneumatic tire, such as dimensions, manufacturer, type, internal pressure, among others. For example, transponders are commonly used that have at least one chip and one antenna, which are usually accommodated jointly in a shock-proof housing made, for example, of rather hard plastics, rubber or metal. In order to save space and obtain the longest possible service life, it is preferred to use inactive transponders which are only activated by an electromagnetic field created by an outer reader via the installed antenna. A drawback of this transponder type is that only the data stored at the time of a reading operation are available, that is, continuous monitoring of the internal tire pressure, for example, is not possible.

International Publication WO 01/25034 A1 discloses electronic components to display not only the tire-typical static data but also operating parameters, such as air pressure and temperature, which have an independent power supply (for example, a battery) enabling continuous storage and transmission of the data records characterizing the operating parameters. However, such systems are complex and sensitive to the tire loads occurring while driving so that they cannot only cause high cost but might also have a limited service life.

The attachment of the respective components or transponders to the interior surface of the respective pneumatic tire is problematic for all the known transponder systems. Since the electronic components usually encapsulated in a pressure-resistant housing are exposed to the tire flexing loads occurring while driving, the rubber body cured directly onto the tire is separated from the dimensionally stable housing of the electronic components after rather long driving routes or operating times of the tire, or both. Some tire manufacturers intend to fix the electronic components on the interior surface of a pneumatic tire so as to rather easily remove them and replace them with new ones after identified damage.

U.S. Pat. No. 6,217,683 discloses a mount system for electronic components, in particular for a transponder, where several pins provided with lateral teeth are fixedly connected to a rather firm large-area rubber ply. One side of the firm rubber base layer is provided with an adhesive layer which is adhered or cured to the optionally mechanically prepared interior surface of the tire. The electronic components, which consist of a chip and an antenna, are accommodated in a dimensionally stable, flat housing having at least one breakthrough. Using the breakthrough this housing is forced onto the protruding pins whose lateral teeth are to prevent unintended removal. A gap having a given gap width is provided between the bottom side of the rather pressure-resistant body and the top side of the rubber base layer to allow for certain balancing movements of the body. When the pneumatic tire is operated for a long time, great forces are also exerted on the elastically deformable pins of this attachment, which limits the service life of this support arrangement.

International Publication WO 03/070496 A1 discloses a mount arrangement for electronic components, in particular a transponder, on the inner side of a pneumatic tire, which contains a rubber ply cured directly onto the tire surface and accommodating the transponder or its pressure-resistant housing, or both. Another rubber ply serves as a cover. The transponder is fixed via what is called a Velcro closure whose loops are arranged at the lower rubber ply and whose hooks are disposed on the upper rubber ply.

German patent 102 43 441 discloses a transponder for tires having a mount arrangement, where at least one chip and one antenna are embedded in a shock-proof body referred to as a substrate. The substrate is decoupled by a connecting structure having a sort of sliding support from the inner side of the tire via a separating medium so as to prevent mechanical stresses, produced by flexing the tire while driving, from being transmitted to the substrate. However, on account of its mass, the substrate is subjected to considerable loads resulting from centrifugal force and extreme braking decelerations. In addition, problems arise from the direct attachment or curing of the connecting structure to the inner side of the tire on account of the high pressure and temperature loads prevailing in the tire production.

European Patent publication 936 089 A describes a mount for an electronic component, in particular a transponder, on the inner side of a pneumatic tire, which has a fully cured protruding rubber body provided with a support cup for the insertion of a transponder body. The body is fixed in the cup by means of adhesion of a screw thread.

SUMMARY OF THE INVENTION

It is a purpose of the invention to create a mount for attaching an electronic component to a rubber article, such as to the inner side of a pneumatic tire, onto a conveyor belt, or the like, which enables an easily detachable or permanent attachment of the electronic component and ensures a fixation also withstanding the high operating loads of a pneumatic tire over long operating times.

The mount according to the invention may have an uncured warm, hot and/or cold curable connecting layer which may be covered with an adhering removable gas-tight and/or opaque protection film up to use. The provision of the protection film may be superfluous depending on the material of the connecting layer. A main body made of uncured, fully or partially cured rubber material, or both, may be disposed on the connecting layer and be provided with a gap or recess for accommodating an electronic component. The main body may have an integrated cover which can fix the electronic component by suitable means. If the connecting layer is made of a fully cured material, an attachment in the tire can be accomplished by a suitable adhesive means, for example.

The mount according to the invention is an independent, removable article and can be attached to a respectively suited point of the interior surface of a pneumatic tire—or another rubber article—by suitable curing processes which are known from the tire and conveyor belt repair technology. For cold-curing it is of advantage that the mount itself and electronic components perhaps previously inserted are not exposed to the elevated temperatures and pressures common for tire curing. The mount can rather also be fixed permanently by cold-curing in a way common for carrying out tire repair to the interior tire surface prepared by chemical or mechanical roughening, for example. This can already be conducted in a suitable step when the tire is produced. Since the attachment of the mount to the tire does not require either elevated temperatures or pressures, the sensitive electronic element can be positioned and fixed in the provided gap before the mount is incorporated. On account of the specific development of the main body, however, it is also possible to first fix permanently the mount in the tire interior and thereafter place the electronic element, that is, the transponder body, in the provided gap and secure it from arbitrary detachment by the means provided according to the invention.

The mount according to the invention has a number of essential functional and practical advantages with respect to conventional mount systems for electronic components. For example, the mount can be attached permanently to a preferred region of the interior surface of the tire in the way common for repair patches by preparing this region, that is, by chemical or mechanical roughening, or both, brushing it with a curing activator and pressing of the mount, in particular a pressure being applied as usual with the necessary tools. When the mount has been attached, in particular by cold-curing, the electronic components, that is, a transponder, can be inserted in the gap provided in the main body, the shape and the dimensions of this gap being adapted to the shape and size of the transponder body. Since the main body material may consist of plastics, rubber-like material, rubber or a suitable rubber material, the transponder body can either be disposed loosely in the gap or forced thereinto by the press of a finger. Depending on the special design of the cover which may consist of one or more layers of main body material, this cover exerts an elastic pressure onto the inserted transponder body and a detachment of the transponder body in the interior of the tire is also effectively prevented. In order to ensure a firm fit of the transponder body in the gap even after long operating times, a useful further development of the invention distinguishes itself by embedding in the cover built up of one or more firmly joined layers strengthening elements which may be corduroy threads common in the tire production and made of textile materials, plastics or metal, separately or in combination, in parallel or lattice-like or fabric-like arrangement, filler fibers guaranteeing tensile strength or the like. The strength of the cover can be raised considerably by these strengthening elements so that even greater transponder bodies are safely held in the main body.

According to a useful embodiment of the invention, the positional fixation of the transponder body in the gap of the main body can be improved in that the cover has shaped elements, such as holes, webs, or the like, which cooperate with corresponding fixing elements, such as pins, grooves, or the like, at the electronic component, that is, at the transponder body, and because of an additional positive engagement secure the transponder body in its gap. Here, the positive engagement can also be achieved by the elasticity of the lug of the main body, so that no fixing elements are required. In a useful embodiment of the invention the cover has two axially parallel lugs changing into the main body material at the end side, which cover the gap in the main body up to its center. In each lug, a hole can be provided with which this lug is forced over a pin mounted on the transponder body under a certain tensile load. In this way, the transponder body is held on both sides by the two lugs and the two pin connections in combination with the inherent elasticity of the two lugs permit minor self-movement of the transponder body and prevent its removal from the main body even if the gap covered by the lugs in the main body is only made as a wide slit and contains no cavity adapted to the shape of the transponder body.

The cover can also be made as a one-piece one-ply or multi-ply lug positioned in the central region of the mount, which with its both ends changes into the main body material and covers a pocket-like gap in the main body material. The approximately tablet-shaped transponder body is inserted laterally under this lug in the corresponding gap in the main body and forced in its fit by the resulting residual stress of the lug. This fit may contain a cavity adapted to the shape of the transponder body. Moreover, a shaped element, for example, a hole or a groove, in the lug-like cover is also useful for this embodiment, that element cooperating with a fixing element formed correspondingly on the transponder body.

The mount according to the invention having mechanical mounting means of the electronic components, in particular a transponder body, is suited for applications in which it is assumed that the service life of the electronic components is shorter than the service life of the respective pneumatic tire or the transponder, or both, is temporarily removed in the course of retreading or another processing step. For example, this can apply to pneumatic tires for commercial vehicles, trucks, and trailers whose mileage is usually several 100,000 kilometers. On account of the strictly mechanical mount, the respectively used transponder bodies can be removed from the main body if an incorrect functional capability of the electronic components is found by the read-outs, for example. Removable transponders have the further advantage that they can be recycled and separated according to predetermined criteria. However, the rather simple design of the transponder bodies is problematic in cases in which, on account of legal provisions or for reasons of product liability, it is requested that the original data of the respective pneumatic tire are assigned to the respective pneumatic tire in a way that cannot be forged or altered over its entire service life. In these cases, the electronic components containing the particular data records have to be attached permanently to or in the tire such that neither the users nor the repairers can remove the electronic components, that is, the transponders, with the written-in data records and replace them by new data records.

In the mount according to the invention, the demand of a permanent attachment of the electronic components in the main body can readily be complied with in that the free spaces around the inserted transponder body are filled with a flowable and curable material which enters into an adhesive connection between the transponder body regions and those of the surrounding main body and has shock-absorbing properties. Curable rubber materials, PUR foams, thermoplastics, and/or silicones are suited as filler materials. This permanent fixation is suited for light-weight transponder bodies having small dimensions, which while running the tire are subject to correspondingly smaller loads by the flexing movements of the tire parts.

BRIEF DESCRIPTION OF THE DRAWING

The objects, features, and advantages of the method according to the invention will be more clearly perceived from the following detailed description, when read in conjunction with the accompanying drawing, in which:

FIG. 1A is a section taken along cutting plane I-I in FIG. 1C of a first mount according to the invention without an inserted transponder body;

FIG. 1B is a similar sectional view with the transponder body installed;

FIG. 1C is a diagrammatic top view of the first mount of FIG. 1;

FIG. 4 is a diagrammatic sectional view of yet another embodiment of the mount according to the invention having an inserted transponder body;

DETAILED DESCRIPTION OF THE PREFERRED EMBODIMENTS

Figure 2:
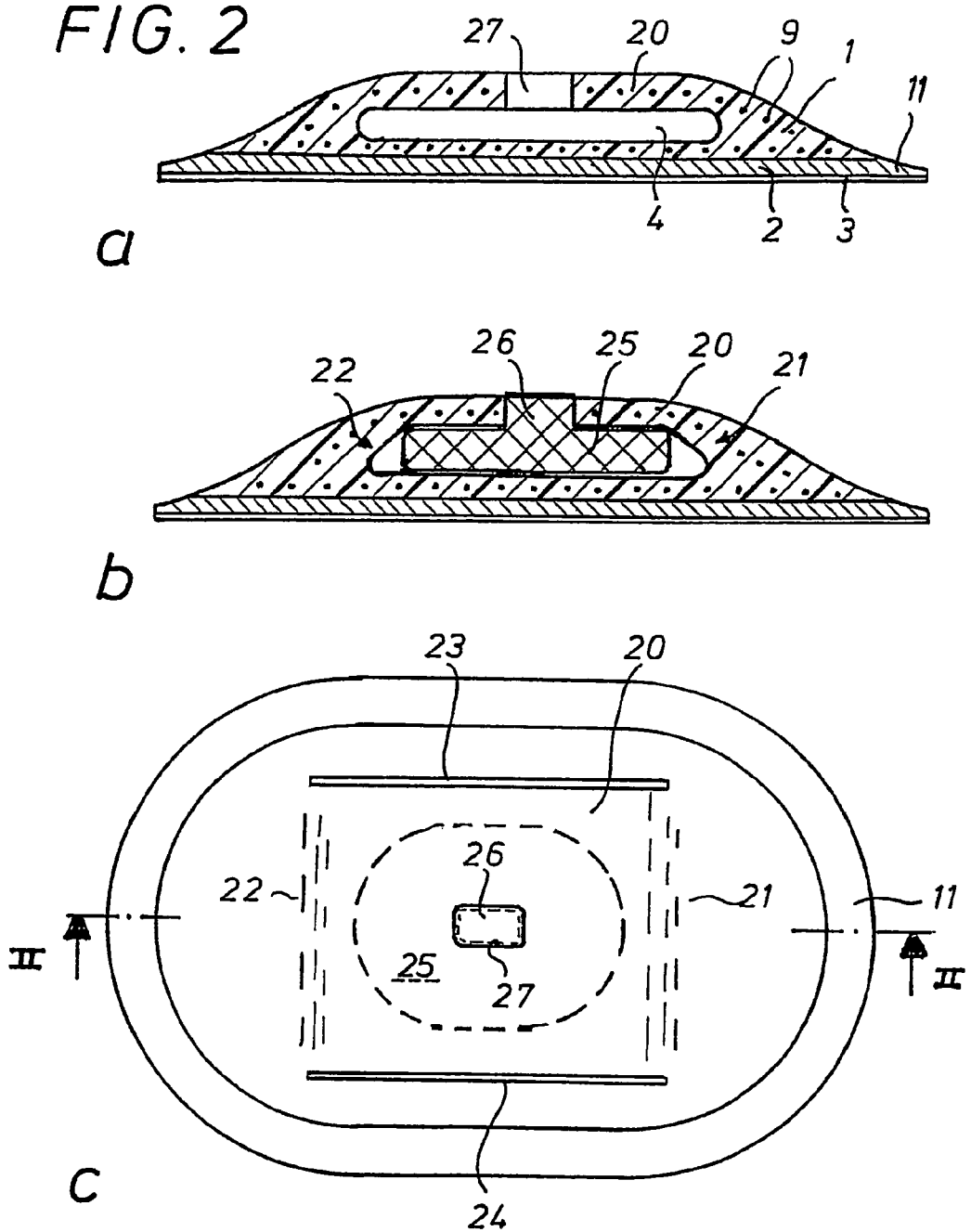
FIG. 2A is a diagrammatic sectional view taken along cutting plane II-II of FIG. 2C of a second mount design without an inserted transponder body.
FIG. 2B is a similar sectional view with the transponder body installed.
FIG. 2C is a diagrammatic top view of the second mount of FIG. 2.

All the mounts and/or patches shown in the drawing are independent products in which one electronic component each, preferably a transponder body, is inserted and fixed. The mounts shown consist of main body 1 which may have a relative height as shown or even a lesser height. In the embodiment according to FIG. 1, this main body 1 consists of a cured rubber material and has a thickness gradually decreasing from its central portion towards its edge. On the bottom side of the main body there is provided continuous connecting layer 2 made of an uncured, partially cured, or fully cured, rubber material, which is covered by protection layer or film 3 made of a suitable plastic. The protection film can adhere to connecting layer 2. This protection layer prevents environmental changes or influences on a subsequent curing of connecting layer 2 during storage and is pulled off directly before the attachment step.

In the embodiment according to FIG. 1, large-area recess or gap 4 having approximately a rectangular shape, for example (see FIG. 3), is formed in the main body, which gap is covered by two lugs 5, 6, also rectangular in a top view. A hole 7, 8 is formed in the front end region of each lug 5, 6. At the end sides, these lugs 5, 6 merge into main body 1 and usefully consist of the main body material. The main body and each lug accommodate thread-like or strand-like strengthening elements 9 which may consist of textile filaments, plastic threads, or metal wires, or any combination thereof. These strengthening elements may have a lattice-like or fabric-like arrangement in the main body material and guarantee the dimensional stability of lugs 5, 6 forming a cover even after extended operating times.

The above mentioned strengthening elements 9 may be provided in any possible embodiment of the invention.

FIG. 1 shows the mount according to the invention in its transport and storage conditions. The top side of mount 1 is covered by thin film 10 made of a suitable plastic which can be glued together with revolving protruding edge 11 of connecting layer 2. In its central portion, this thin protection film 10 can have a grip fold 12 to facilitate the removal of the film by a finger grip. Moreover, gap 4 in main body 1 can also be lined with another protection film 13 which also has a grip fold 14 protruding through the end slit between lugs 5, 6.

According to FIGS. 1(B) and 1(C), disk-like electronic component or transponder body 15, rectangular in a top view, is inserted in gap 4 of main body 1. Gap 4 can be configured such that all suitable shapes of transponder bodies can be accommodated. Transponder body 15 contains in a firmly embedded fashion at least one chip having written-in data records and at least one antenna as well as, optionally, sensors 16 arranged in its central portion below the opening for detecting different information data such as, for example, internal tire pressure. Transponder body 15 preferably consists of a material that is pressure-resistant and dimensionally stable in itself so that the sensitive electronic components, in particular the antenna connection to the chip, are largely protected from damage resulting from shocks. As evident from FIG. 1(B), the transponder body has two upwardly protruding dowels or pins 17, 18, which, in the embodiment as shown, are conical but may also have other shapes. These pins 17, 18 are accommodated in holes 7, 8 of respective lugs 5, 6 so as to fix the position of transponder body 15 in gap 4.

In order to insert transponder body 15 in gap 4 of main body 1, lugs 5, 6 are bent back and transponder body 15 is inserted in the thus opened gap 4. After this positioning, both lugs 5, 6 are bent back flat and forced with their holes 7, 8 over pins 17, 18.

The basic assembly of the embodiment shown in FIG. 2(A) to 2(C) corresponds to the mount described above according to FIG. 1 so that similar components have equivalent reference numerals. This mount, too, has main body 1 reinforced by strengthening elements 9 and made of a cured rubber material, connecting layer 2 continuously attached to the bottom side of the main body and made of uncured rubber material, and lower protection film 3. In order to protect the main body during storage and transport, thin protection film 10 according to FIG. 1 can cover the top side of the main body. In the mount shown in FIG. 2, gap 4 formed in main body 1 is covered by a continuous lug 20 which, as outlined in FIG. 2(C), by the parallel broken dotted lines 21, 22, integrally changes into the main body material and is laterally separated from the main body material or gap 4 by slits 23, 24. In this case rounded disk-like transponder body 25 is inserted through one of these slits. The transponder body is shown in FIG. 2(B) in crosshatch and in FIG. 2(C) in a broken dotted line. In its central portion, transponder body 25 has an approximately rectangular pin 26 which, after its insertion in gap 4, protrudes through hole 27 formed in the lug-like cover. When transponder body 25 is inserted laterally through one of slits 23, 24, the lug-like cover is tensioned and resiliently stretched so that after the transponder is inserted a permanent contact pressure is exerted on the transponder body. This contact pressure, in combination with the positive incorporation of its pin 26 in hole 27, ensures the necessary positional fixation and enables minor evasive movements in the case of impact loads.

Figure 3:
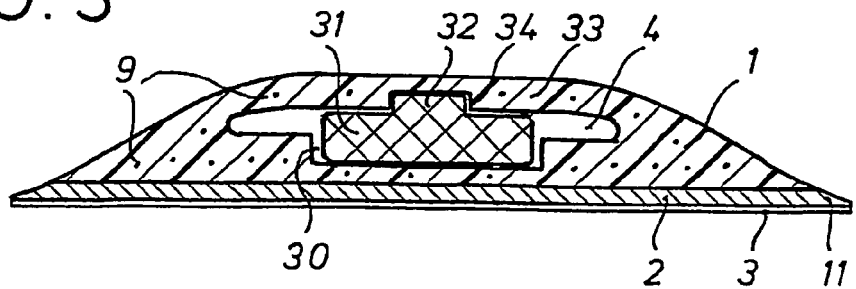
FIG. 3 is a diagrammatic sectional view of another embodiment of the mount according to the invention with inserted transponder body.

The mount shown in FIG. 3 largely corresponds to the embodiment of FIG. 2 so that similar components have equivalent reference numerals. In this embodiment, the central portion of gap 4 has a lower cavity 30 whose shape is adapted to the peripheral outline of transponder body 31 so that its base is rather tightly enclosed by the lateral walls of this cavity. Ridge 32 is formed on the top side of transponder body 31, which positively engages transverse groove 34 formed in covering lug 33. In this embodiment, lug-like cover 33, which is the same element as covering lug 33, may have the shape shown in FIG. 2(B) and may be limited by two lateral slits 23, 24. However, it is also possible for lug-like cover or covering lug 33 to be integral with or merge into the material of main body 1 at both ends and on one side and to only have a single lateral slit 24 so as to result in the shape of a pocket. In this pocket, transponder body 31 is inserted through a single lateral slit in gap 4 until the base portion of transponder body 31 is accommodated in cavity 30. In this embodiment as well, lug-like cover or covering lug 33 can exert a continuous elastic contact pressure on the inserted transponder body whose positional stability is secured by cavity 30 and additionally by the positive meshing of transverse ridge 32 with transverse groove 34. As stated above, lug-like cover 33 is the same element as covering lug 33, and the two equivalent terms are employed here because both are used in the industry.

As regards its basic design, the embodiment shown in FIG. 4 also largely corresponds to the above described mounts according to FIGS. 1-3 so that here, too, similar components have equivalent reference numerals. In the mount according to FIG. 4, single lug 35 has its left end integral with main body 1 so that this lug can be opened from the position shown in the direction of the arrow so as to render accessible gap 4 formed in the main body to insert tablet-like transponder body 36. Having positioned transponder body 36, the free spaces remaining in gap 4 can be filled with a suitable, preferably flowable, filler material 37 which tightly encloses transponder body 36. This filler material can be a curable rubber mixture, a PUR foam, an elastomer, or a silicone, among others, or a combination of such materials. Appropriately, this filler 37 should have shock-absorbing properties and enter into firmly adhering connections with the surrounding areas. Having inserted the transponder body 36 and filled the free spaces with filler 37, lug 35 is returned into its position as shown and firmly connected with the lower main body material over a large area by suitable measures, such as by applying suitable adhesives or by cold-curing, for example. The connecting surface of tongue-like cover 35 with the lower material of main body 1 is denoted by reference numeral 38. This embodiment is particularly designed for a permanent fixation of transponder body 36 to the interior surface of a pneumatic tire, its positional fixation being ensured by the shape of gap 4 and fillers 37 as well as by a sufficiently firm cover by means of the lug-like tongue 35.

Figure 5:
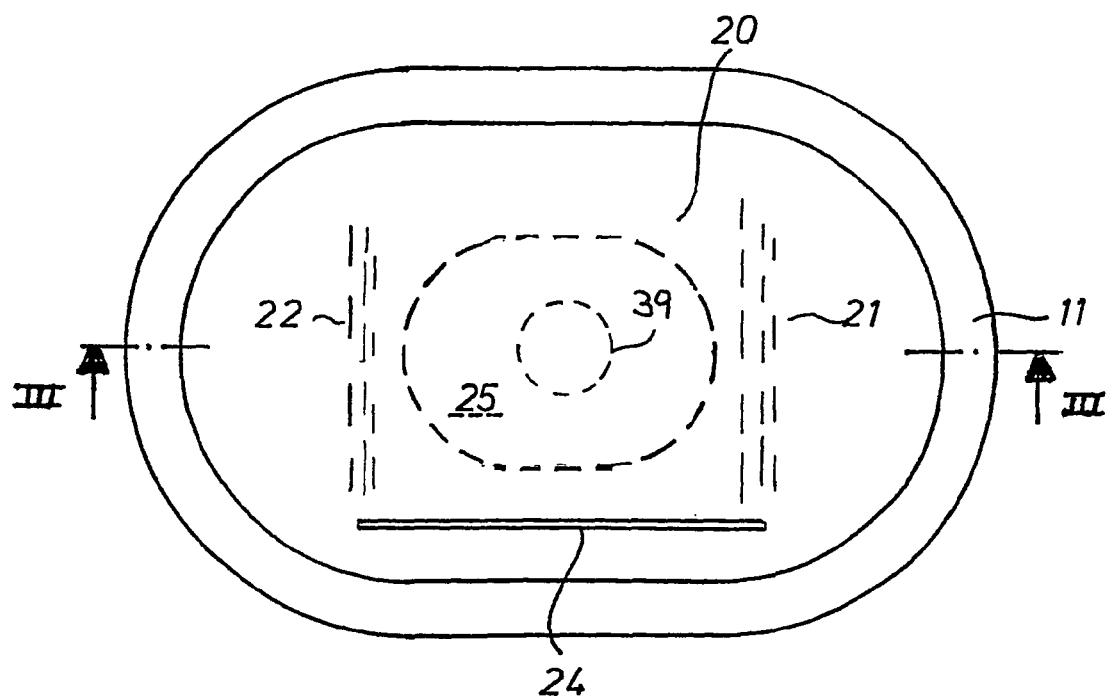
FIG. 5A is another embodiment of the mount according to the invention in cross-section without a transponder body.
FIG. 5B is a similar sectional view with the transponder body installed taken along cutting plane III-III of FIG. 5C.
FIG. 5C is a top view of the mount of FIG. 5B.
FIG. 5D is another top view of the mount of FIG. 5B but with a single access slit.

In gap 4, the mount shown in FIG. 5 has mounting means 39 arranged at main body 1. As shown in FIG. 5A, mounting means 39 can protrude into gap 4. Transponder body 25 can have a corresponding counterpart or depression to engage mounting means 39. When transponder body 25 has been inserted in gap 4 of the main body, this counterpart can mesh with mounting means 39 so as to fix the position of the transponder body in gap 4. Mounting means 39 can be a locking element, for example, which engages a corresponding counterpart in the transponder body. An example is a push button-like mechanism that can be used as the locking element. Mounting means 39 is suited for permanently attaching transponder body 25 to the main body and additionally permits detachment of the attachment if this is desired. For example, a locking nub provided with teeth can also be provided as mounting means 39 which, in turn, engages the corresponding counterpart at transponder body 25. The above mentioned counterparts of transponder body 25 are firmly connected with the transponder body. Of course, it is also possible to provide other suitable mounting means with corresponding counterparts.

It is also possible for the mount shown in FIG. 5 to have one slit 24 (FIG. 5D) or two lateral slits 23, 24. These alternatives are shown in FIGS. 5D and 5C, respectively. The transponder body can be inserted in gap 4 through this slit 24 or through one of the two slits 23, 24 to be then attached via mounting means 39 and its counterpart. If only one slit 24 is provided, lug 20 forms a pocket into which the transponder body is inserted.

It is also possible to provide no mounting means, the transponder body itself having, for example, a transverse, longitudinal, or inclined ridge, or combination thereof, which in the inserted condition is then held by the elasticity of continuous lug 20. In this case, the lug will deform somewhat upwardly at the point of the ridge so that there is sufficient holding force. It is also possible for the transponder body to have no ridge or elevation and be only held by the elasticity of lug 20.

The invention is not limited to the embodiments as shown. For example, adhesives and fillers can also be inserted in the remaining free spaces of the gap in the embodiments according to FIGS. 1 to 3 and 5, as well to obtain a permanent fixation of the respective transponder body. The transponder bodies may also have different shapes and can be, for example, be made as cylindrical bodies which can then be accommodated in correspondingly shaped gaps or cavities in main body 1 in a positively engaged way. Finally, a suitable combination of measures realized in one or more embodiments is also possible for other embodiments.

What is claimed is:

1. An apparatus for attaching an electronic component to a rubber article, the electronic component having at least one protrusion thereon, the apparatus comprising:
   a main body having a first side and an opposite second side, and having a recess therein for receiving the electronic component;
   a connecting layer mounted on the first side of said main body;
   a removable protective film on said connecting layer; and
   an integrated cover on the second side of said main body, said cover selectively covering said recess and having at least one depression therein to accommodate the at least one protrusion and having at least one lateral slot therethrough to enable the electronic component to be inserted into the recess.

2. The mount according to claim 1, and further comprising strengthening elements embedded in said cover.

3. The mount according to claim 1, wherein said cover comprises at least one shaped fixing element configured for fixing the position of the electronic component in said recess in cooperation with the electronic component.

4. The mount according to claim 1, wherein the shape of said recess is configured to receive the shape of the electronic component.

5. The mount according to claim 1, wherein said recess has a cavity shaped to correspond to the peripheral outline of the electronic component.

6. The mount according to claim 1, wherein said cover is formed with a lug which, on both ends, is integral with said main body, the width of said lug exceeding the width of said recess.

7. The mount according to claim 1, wherein the electronic component is a transponder body.

8. The mount according to claim 1, wherein said connecting layer is selected from the group consisting of material that is uncured, curable, partially cured, and fully cured.

9. The mount according to claim 1, wherein said main body is selected from the group consisting of material that is uncured, curable, partially cured, and fully cured.

10. The mount according to claim 2, wherein said cover comprises at least one shaped fixing element configured for fixing the position of the electronic component in said recess in cooperation with the electronic component.

11. The mount according to claim 3, wherein the shape of said recess is configured to receive the shape of the electronic component.

12. The mount according to claim 6, and further comprising a mounting means on the inner side of said lug, said mounting means being configured to mesh with a counterpart portion formed on the electronic component.

* * * * *